US008552766B2

(12) United States Patent
Stracquadaini

(10) Patent No.: US 8,552,766 B2
(45) Date of Patent: Oct. 8, 2013

(54) THRESHOLD COMPARATOR WITH HYSTERESIS AND METHOD FOR PERFORMING THRESHOLD COMPARISON WITH HYSTERESIS

(75) Inventor: Rosario Stracquadaini, Vittoria (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 204 days.

(21) Appl. No.: 12/958,769

(22) Filed: Dec. 2, 2010

(65) Prior Publication Data
US 2011/0148468 A1 Jun. 23, 2011

(30) Foreign Application Priority Data
Dec. 22, 2009 (IT) ............................. TO2009A1027

(51) Int. Cl.
*H03K 5/153* (2006.01)
(52) U.S. Cl.
USPC ............................. 327/75; 327/205; 327/77
(58) Field of Classification Search
USPC ................................. 327/77, 205–206, 74, 75
See application file for complete search history.

(56) References Cited

U.S. PATENT DOCUMENTS

| | | | |
|---|---|---|---|
| 5,122,680 A | 6/1992 | Stakely et al. | |
| 5,426,386 A * | 6/1995 | Matthews et al. | ............... 327/63 |
| 6,172,492 B1 | 1/2001 | Pletcher et al. | |
| 6,825,735 B2 * | 11/2004 | Chung | ............................ 331/135 |
| 6,828,828 B2 * | 12/2004 | Marshall et al. | ............... 327/68 |
| 7,652,508 B2 * | 1/2010 | Maeda et al. | ................... 327/72 |
| 2005/0162207 A1 | 7/2005 | Kamei | |
| 2005/0206422 A1 * | 9/2005 | Mehas et al. | .................. 327/205 |
| 2007/0064779 A1 | 3/2007 | Kappes et al. | |

FOREIGN PATENT DOCUMENTS

| | | |
|---|---|---|
| DE | 19732671 A1 | 4/1998 |
| EP | 1 531 548 A2 | 5/2005 |

OTHER PUBLICATIONS

Italian Search Report dated Sep. 13, 2010 from corresponding Italian Application No. TO2009A001027.
Written Opinion dated Sep. 13, 2010 from corresponding Italian Application No. TO2009A001027.

* cited by examiner

*Primary Examiner* — Quan Tra
(74) *Attorney, Agent, or Firm* — Wolf, Greenfield & Sacks, P.C.

(57) ABSTRACT

A threshold comparator with hysteresis includes a comparator circuit, having a first input, for receiving an input voltage, a second input, and an output, which supplies an output voltage having a first value and a second value. A current generator, controlled by the output voltage, supplies a current to the first input in the presence selectively of one between the first value and second value of the output voltage. A selector circuit connects the second input of the comparator circuit to a first reference voltage source, which supplies a first reference voltage, in response to first edges of the output voltage, and to a second reference voltage source, which supplies a second reference voltage, in response to second edges of the output voltage, opposite to the first edges.

19 Claims, 3 Drawing Sheets

THRESHOLD COMPARATOR WITH HYSTERESIS AND METHOD FOR PERFORMING THRESHOLD COMPARISON WITH HYSTERESIS

CROSS REFERENCE TO RELATED APPLICATIONS

This application claims the priority benefit of Italian patent application number TO2009A001027, filed on Dec. 22, 2009, entitled "Threshold Comparator with Hysteresis and method for Performing Threshold Comparison with Hysteresis," which is hereby incorporated by reference to the maximum extent allowable by law.

BACKGROUND OF THE INVENTION

1. Field of Invention

The present invention relates to a threshold comparator with hysteresis and to a method for performing a threshold comparison with hysteresis.

2. Discussion of the Related Art

As is known, in many applications in the electronics sector, the state of operation of a system should be modified when given conditions arise. For this reason, there is frequently the need to monitor electrical quantities that are critical or indicate a state of critical operation.

Just to provide an example, in the case of switching power supplies connected to an energy-distribution network, it may be advantageous to provide a protection device that disables switching when the input voltage is too low (brownout protection). A situation of this kind may commonly arise owing to the normal fluctuations that involve any energy-distribution network.

A switching power supply usually comprises a rectifier circuit (for example, a diode bridge with a filter capacitor), connected downstream of which is a switching converter. The rectifier circuit receives the AC mains voltage and supplies a non-regulated DC voltage, which is received by the switching converter and converted into a regulated DC output voltage. When the non-regulated DC voltage on the output of the rectifier circuit drops below a first threshold, the converter is disabled. Normal operation of the converter is restored when the non-regulated DC voltage returns above a second threshold, higher than the first threshold. The hysteresis thus created enables prevention of excessively frequent state transitions, in particular when the voltage to be monitored and the reference voltage are very close to one another.

To monitor the non-regulated DC voltage, a comparator with hysteresis is normally used, which compares the voltage to be monitored with a reference voltage and supplies a signal indicating the outcome of the comparison. Said signal is then used for determining the state of operation of the system.

The example described is obviously a particular case, and it remains clear that the same requirements can arise in many applications or for various reasons in the framework of one and the same application.

Known comparators with hysteresis, however, do not solve the problem of undesired switchings in an altogether satisfactory way.

If the electrical quantity to be monitored is affected by high-frequency noise, undesirable switchings may, in any case, occur during the step of transition from the first threshold to the second threshold and vice versa, especially if considerable capacitances are coupled to one of the input terminals of the comparator. The presence of even relatively slight disturbance may hence lead to a delay before the output of the comparator assumes a stable configuration.

SUMMARY OF THE INVENTION

An aim of at least one embodiment of the present invention is to provide a threshold comparator with hysteresis and a method for performing a threshold comparison with hysteresis, which enable the limitations described to be overcome and, in particular, reduction of the risk of undesirable switchings on account of disturbance.

According to at least one embodiment, there is provided a threshold comparator with hysteresis comprising an input terminal, a comparator circuit, having a first input, coupled to the input terminal for receiving an input voltage, a second input and an output for providing an output voltage having a first value, when the first input is at a higher voltage than the second input, and a second value, when the first input is at a lower voltage than the second input, a current generator, coupled to the input terminal and controlled by the output voltage for supplying a hysteresis current to the input terminal in the presence of selectively one of the first value and the second value of the output voltage, at least a first reference voltage source and a second reference voltage source, for providing respectively a first reference voltage and a second reference voltage, lower than the first reference voltage and a selective coupling circuit, controlled by the output voltage of the comparator circuit and configured to couple the second input of the comparator circuit to the first reference voltage source, in response to first edges of the output voltage, and to the second reference voltage source, in response to second edges of the output voltage, opposite to the first edges.

According to another embodiment, the threshold comparator comprises a third reference voltage source, for providing a third reference voltage, intermediate between the first reference voltage and the second reference voltage, wherein the selective coupling circuit is configured to couple the second input of the comparator circuit to the third reference voltage source after a controlled duration since each first edge and since each second edge of the output voltage.

According to another embodiment, the selective coupling circuit comprises a selector device, having connection inputs respectively connected to the first reference voltage source, to the second reference voltage source and to the third reference voltage source, and a timer circuit coupled to the output of the comparator circuit for receiving the output voltage and configured to control the selector device so as to couple the second input of the comparator circuit to one of the first reference voltage source and the second reference voltage source for the duration in response to the first edges and to the second edges of the output voltage.

According to another embodiment, the selector device has a first control terminal connected to an output of the timer circuit and a second control terminal connected to the output of the comparator circuit for receiving the output voltage.

According to another embodiment, the selector device comprises a first two-way selector and a second two-way selector and wherein the first two-way selector has inputs respectively connected to an output del second two-way selector and to the third reference voltage source, a control terminal defining the first control terminal and an output connected to the second input of the comparator circuit and the second two-way selector has inputs respectively connected to the first reference voltage source and to the second reference voltage source and a control terminal defining the second control terminal.

According to another embodiment, the selector device comprises a multiplexer having connection inputs respectively connected to the first reference voltage source, to the second reference voltage source and to the third reference voltage source.

According to another embodiment, the timer circuit is configured to provide timing pulses having the duration, in response to each first edge and to each second edge of the output voltage.

According to another embodiment, the comparator circuit is configured so that the first edges are determined by decrements of the input voltage on first input of the comparator circuit and the second edges are determined by increments of the input voltage on the first input of the comparator circuit.

According to another embodiment, the current generator is controlled so as to cause a decrement of the input voltage, in response to the first edges of the output voltage, and an increment of the input voltage, in response to the second edges of the output voltage.

According to another embodiment, the threshold comparator further comprises an input resistive divider having a first terminal and a second terminal, for receiving a voltage, and a control terminal, intermediate between the first terminal and the second terminal and connected to the input terminal.

According to another embodiment, the threshold comparator with hysteresis is incorporated into an electronic apparatus.

According to another embodiment, there is provided a method for performing threshold comparison with hysteresis of a voltage comprising supplying an input voltage to a first input of a comparator circuit, having a second input and an output configured to provide an output voltage having a first value, when the first input s at a higher voltage than the second input, and a second value, when the first input is at a lower voltage than the second input supplying a hysteresis current to the input terminal in the presence of selectively one of the first value and the second value of the output voltage and providing the second input of the comparator circuit with a first reference voltage, in response to first edges of the output voltage, and a second reference voltage, lower than the first reference voltage, in response to second edges of the output voltage, opposite to the first edges.

According to another embodiment, the method comprises providing the second input of the comparator circuit with a third reference voltage, intermediate between the first reference voltage and the second reference voltage, after a controlled duration since each first edge and since each second edge of the output voltage.

According to another embodiment, the comparator circuit is configured so that the first edges are caused by decrements of the input voltage on the first input of the comparator circuit and the second edges are caused by increments of the input voltage on the first input of the comparator circuit.

According to another embodiment, wherein supplying the hysteresis current to the input terminal in the presence of selectively one of the first value and the second value of the output voltage comprises causing decrements of the input voltage, in response to the first edges of the output voltage, and increments of the input voltage, in response to the second edges of the output voltage.

BRIEF DESCRIPTION OF THE DRAWINGS

For a better understanding of the invention, some embodiments thereof will now be described, purely by way of non-limiting example and with reference to the attached drawings, wherein.

DETAILED DESCRIPTION

Figure 1:
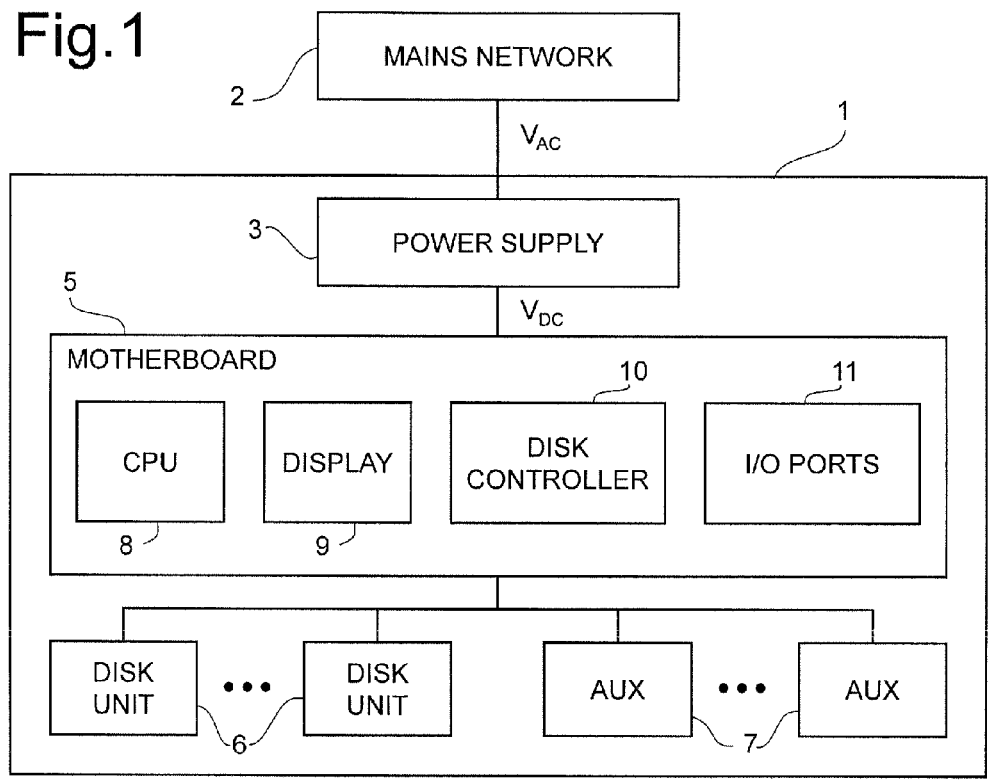
FIG. 1 is a simplified block diagram of an electronic system incorporating a switching power supply.

FIG. 1 is a schematic illustration of an electronic system, in particular a computer system 1, connected to a mains network 2 for receiving an AC supply voltage $V_{AC}$.

The computer system 1 comprises a power supply 3, a motherboard 5, and peripheral devices, among which a plurality of disk units 6 and auxiliary boards 7.

In addition, a plurality of devices are mounted on the motherboard are, such as, for example, a central processing unit 8, a video processor 9, a disk controller 10, and input/output (I/O) ports 11 with corresponding controllers. The computer system 1 can of course be equipped with further devices, either separate or mounted on the motherboard 5 (not illustrated or described herein for reasons of simplicity).

The power supply 3 is connected to the mains network 2 and converts the AC supply voltage $V_{AC}$, supplied by the mains network 2, into a DC supply voltage $V_{DC}$, which is supplied to the motherboard 5 and, directly or through the motherboard 5, to the peripheral devices, in particular to the disk units 6 and to the auxiliary boards 7 in the embodiment described. In turn, the motherboard 5 uses the DC supply voltage $V_{DC}$ for supplying the devices that are mounted thereon, as required.

Figure 2:
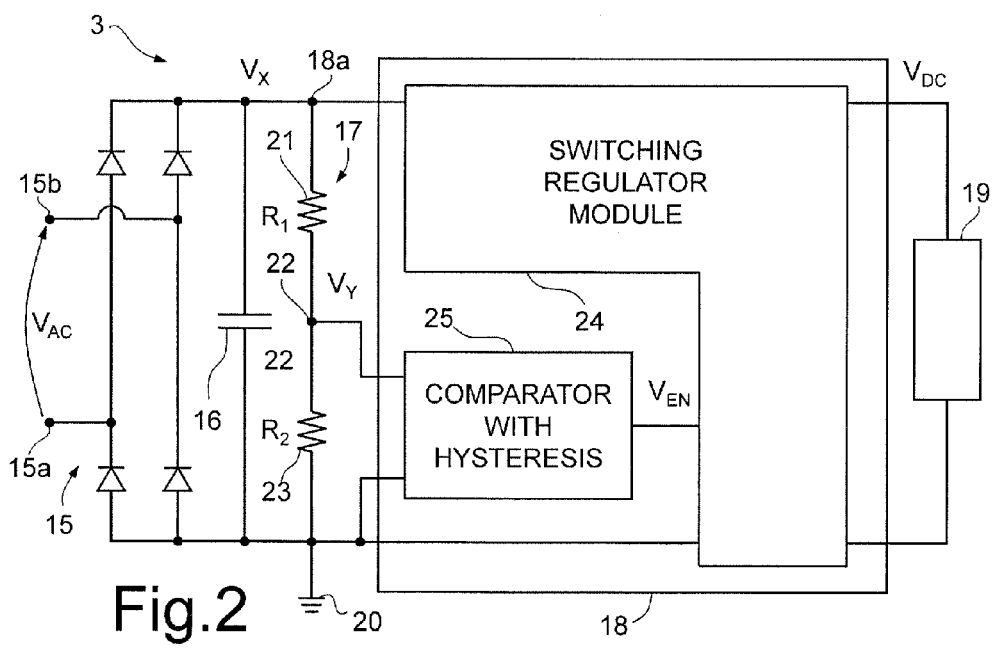
FIG. 2 is a simplified circuit diagram regarding the power supply of FIG. 1.

FIG. 2 shows in greater detail the power supply 3, which in one embodiment is of the switching type. The power supply 3 comprises a diode-bridge rectifier 15, an input capacitive filter 16, a resistive divider 17, and a DC-DC converter 18, which supplies the DC supply voltage $V_{DC}$ to a load 19. In the example described herein, the load 19 is defined by the motherboard 5 and by the peripheral devices of the computer system 1.

The rectifier 15 has input terminals 15a, 15b connected to the mains network 2 and output terminals respectively connected to a ground line 20 and to an input terminal 18a of the DC-DC converter 18. The input capacitive filter 16 is connected between the ground line 20 and the input terminal 18a of the DC-DC converter 18, as likewise is the resistive divider 17. In greater detail, the resistive divider 17 comprises: a first resistor 21, connected between the input terminal 18a of the DC-DC converter 18 and a control node 22 and having a first resistance $R_1$; and a second resistor 23, connected between the control node 22 and the ground line 20 and having a second resistance $R_2$.

The DC-DC converter 18 comprises a switching module 24 and a comparator with hysteresis 25.

The switching regulator module 24, of a known type, receives a rectified voltage $V_X$ from the input terminal 18a and supplies the DC supply voltage $V_{DC}$ to the load 19.

The comparator with hysteresis 25 has a first input connected to the control node 22, on which an input voltage $V_Y$ is present, and a second input connected to the ground line 20. The comparator with hysteresis 25 is configured to disable the switching regulator module 24 when the rectified voltage $V_X$ drops below a first threshold and to enable the switching regulator module 24 when the rectified voltage $V_X$ rises above a second threshold, higher than the first threshold. For this purpose, the comparator with hysteresis 25 has an output connected to an enable input of the switching regulator module 24 for supplying an enable voltage $V_{EN}$.

Figure 3:
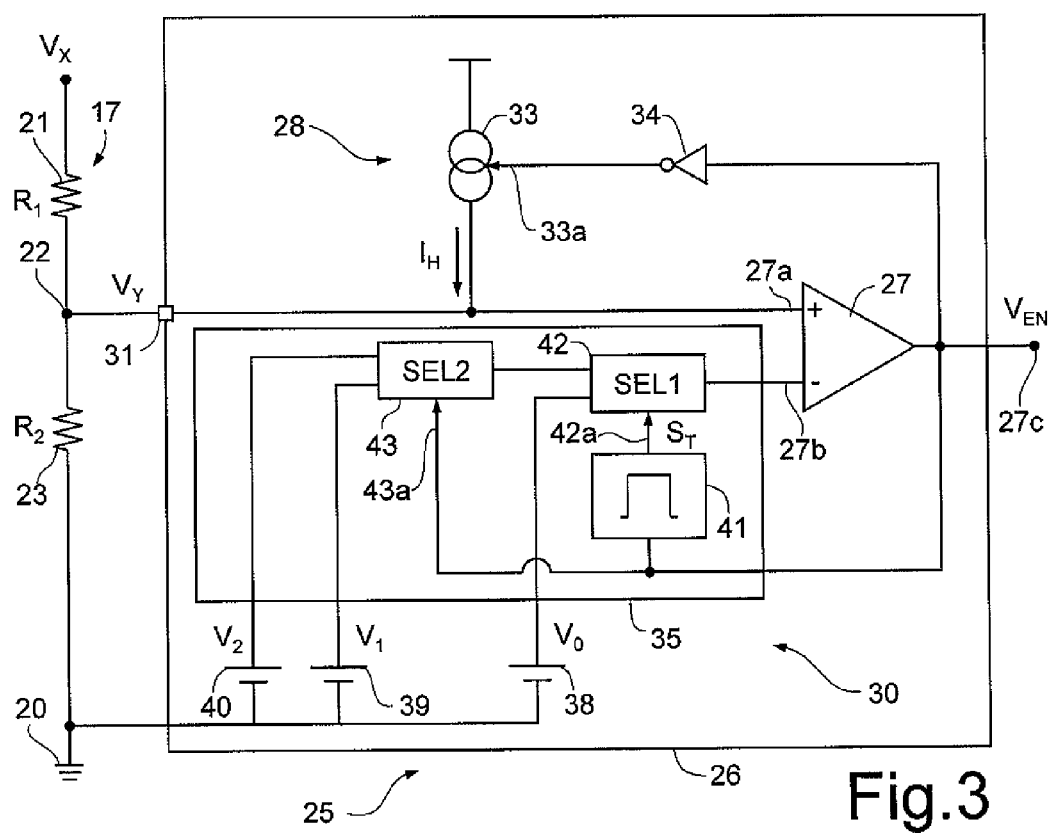
FIG. 3 is a more detailed circuit diagram of a threshold comparator with hysteresis, incorporated in the power supply of FIG. 2 and built according to one embodiment of the present invention.

FIG. 3 shows in greater detail the comparator with hysteresis 25, which is provided as stand-alone circuit integrated in a dedicated chip 26 and comprises a comparator circuit 27, a current hysteresis circuit 28, and a voltage hysteresis circuit 30.

The comparator circuit 27 has: a first input 27a, for example a non-inverting input, connected to the control node 22 of the resistive divider 17 through a pin 31 of the chip 26 and defining the first input of the comparator with hysteresis 25; and a second input 27b, for example an inverting input, connected to an output of the voltage hysteresis circuit 30 for receiving a reference voltage, as described in detail hereinafter.

An output 27c of the comparator circuit 27 supplies an output voltage, defining the enable voltage $V_{EN}$. In detail, the enable voltage $V_{EN}$ has a first value $V_{EN1}$ (for example, a high value) when the voltage on the first input 27a (i.e., the input voltage $V_Y$ in the example described) is higher than the voltage on the second input 27b, and a second value $V_{EN2}$ (for example a low value) otherwise.

The current hysteresis circuit 28 is configured to supply a hysteresis current $I_H$ to the control node 22 of the resistive divider 17 when the output of the comparator circuit 27 assumes selectively one between the first value $V_{EN1}$ and the second value $V_{EN2}$, for example the first value $V_{EN1}$. Otherwise, the current hysteresis circuit 28 is inactive.

In detail, the current hysteresis circuit 28 comprises a current generator 33, having a terminal connected to the first input 27a of the comparator circuit 27 and, through the pin 31, to the control node 22 of the resistive divider 17. The current generator 33 is controlled by the comparator circuit 27 so as to supply the hysteresis current $I_H$ selectively when the voltage on the first input 27a is higher than the voltage on the second input 27b. For this purpose, the output 27c of the comparator circuit 27 is coupled to a control terminal 33a of the current generator 33. In the embodiment illustrated, in particular, the current generator 33 is active when its control terminal receives a low voltage. Consequently, the enable voltage $V_{EN}$ supplied by the comparator circuit 27 is supplied to the control terminal 33a through a logic element, here an inverter 34. It is understood, however, that, in other embodiments, the current generator 33 can be controlled directly by the enable voltage $V_{EN}$ and, moreover, can be activated in the presence of the first value, instead of the second value, by the enable voltage $V_{EN}$.

The voltage hysteresis circuit 30 comprises a timed selector circuit 35, which is controlled by the enable voltage $V_{EN}$ supplied by the output 27c of the comparator circuit 27, a standard voltage source 38, and a first hysteresis voltage source 39 and a second hysteresis voltage source 40, connected to respective selection inputs of the timed selector circuit 35. In addition, the standard voltage source 38 supplies a standard reference voltage $V_0$, while the first and second hysteresis voltage sources 39, 40 supply, respectively, a first hysteresis reference voltage $V_1$ (higher than the standard reference voltage $V_0$) and a second hysteresis reference voltage $V_2$ (lower than the standard reference voltage $V_0$).

The timed selector circuit 35 comprises a timer 41, a first two-way selector 42, and a second two-way selector 43 and is configured to couple the second input 27b of the comparator circuit 27 selectively to one between the standard voltage source 38, the first hysteresis voltage source 39 and the second hysteresis voltage source 40.

In one embodiment, the timer 41 comprises a monostable circuit that supplies timing pulses $S_T$ of duration T (see also FIG. 4) in response to both rising and falling edges received at input. In detail, the timer 41 has an input connected to the output of the comparator circuit 27, for receiving the enable voltage $V_{EN}$, and an output connected to a command terminal 42a of the first two-way selector 42 for supplying the timing pulses $S_T$ in response to each edge (i.e., to each switching) of the enable voltage $V_{EN}$.

The first two-way selector 42 has a first input connected to the standard voltage source 38 and a second input connected to the output of the second two-way selector 43. The control terminal 42a of the first two-way selector 42 is connected to the output of the timer 43 for receiving the timing pulses $S_T$, as already mentioned. The output of the first two-way selector 42 is moreover connected to the second input 27b of the comparator circuit 27.

The first two-way selector 42 is configured to connect the second input 27b of the comparator circuit 27 to the standard voltage source 38, in the absence of a timing pulse $S_T$ (in practice, at a distance greater than the duration T from the last switching of the enable voltage $V_{EN}$). In the presence of timing pulses $S_T$, instead, the first two-way selector 43 connects the second input 27b of the comparator circuit 27 to the output of the second two-way selector 43.

The second two-way selector 43 has a first input and a second input, connected to the first hysteresis voltage source 39 and to the second hysteresis voltage source 40 respectively, while a control terminal 43a receives the enable voltage $V_{EN}$ directly from the output 27c of the comparator circuit 27. The output of the second two-way selector 43 is connected to the first hysteresis voltage source 39 when the enable voltage $V_{EN}$ has the first value $V_{EN1}$, and to the second hysteresis voltage source 40 when the enable voltage $V_{EN}$ has the second value $V_{EN2}$.

Figure 4:
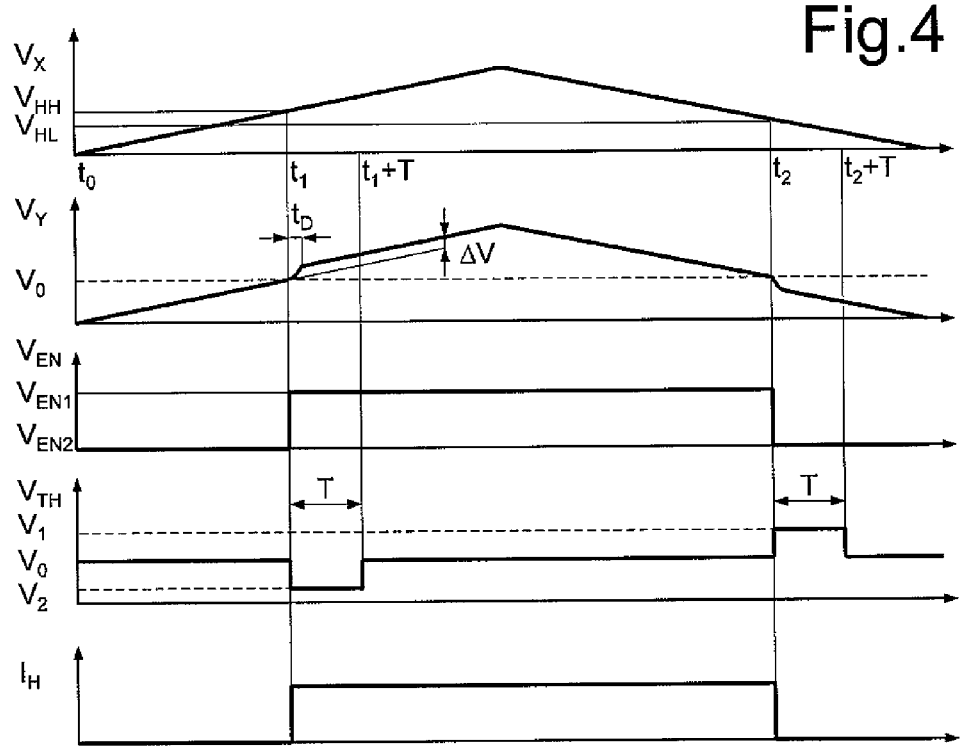
FIG. 4 shows graphs regarding the threshold comparator with hysteresis of FIG. 3.

FIG. 4 illustrates a situation provided purely by way of example, in which the rectified voltage $V_X$ is initially low and has an evolution that increases for a period (for example upon turning-on or following upon a drop in the AC supply voltage $V_{AC}$), and then decreases. It is to be noted that the situation described and illustrated does not necessarily correspond to a realistic operating condition and is examined in order to clarify operation of the comparator with hysteresis 25.

In a first period (FIG. 4, interval $t_0$-$t_1$), the enable voltage $V_{EN}$ has the second value $V_{EN2}$ (low in this case), the current generator 33 is disabled, and the second input 27b of the comparator circuit 27 receives the standard reference voltage $V_0$ from the standard voltage source 38. The configuration of the comparator with hysteresis 25 is kept as long as the input voltage $V_Y$ is lower than the value of the standard reference voltage $V_0$ (instant $t_1$), i.e., as long as the rectified voltage $V_X$ remains lower than an upper hysteresis threshold $V_{HH}$, which in the embodiment illustrated is $$V_{HH} = \frac{R_1 + R_2}{R_2} V_0$$

In these conditions, the switching regulator module 24 is disabled and, in practice, the load 19 is not supplied.

As soon as the input voltage $V_Y$ exceeds the standard reference voltage $V_0$, the enable voltage $V_{EN}$ switches to the first value $V_{EN1}$ (high, rising edge) and activates the current generator 33, which supplies the hysteresis current $I_H$ to the control node 22. In response to activation of the current generator 33, the input voltage $V_Y$ is incremented by an amount $$\Delta V = \frac{R_1 R_2}{R_1 + R_2} I_H$$

Given the presence at least of parasitic capacitances associated to the control node 22, an increment in the input voltage $V_Y$ is completed in a transient of duration $t_D$. Note that the duration T of the timing pulses $S_T$ is longer than the duration $t_D$ of the transients of increment (or decrement, as described hereinafter) of the input voltage $V_Y$.

Simultaneously, following upon switching of the enable voltage $V_{EN}$ to the first value $V_{EN1}$, the timer 41 supplies a timing pulse $S_T$. Consequently, the first two-way selector 42 and the second two-way selector 43 switch, thus connecting the second hysteresis voltage source 40 to the second input 27b of the comparator circuit 27, which receives the second hysteresis reference voltage $V_2$. In this step, then, the comparator circuit 27 does not switch unless the input voltage $V_Y$ (incremented following upon turning-on of the current generator 33) drops below the second hysteresis reference voltage $V_2$ (lower than the standard reference voltage $V_0$). When the timing pulse $S_T$ terminates (FIG. 4, instant $t_1+T$), the first two-way selector 42 switches once again. Hence, the connection of the second input 27b of the comparator circuit 27 to the standard voltage source 38 is restored.

At this point, the comparator circuit 27 switches when the input voltage $V_Y$ drops below the standard reference voltage $V_0$ (falling edge of the enable voltage $V_{EN}$, opposite to the rising edge). Given that the current generator 33 supplies the hysteresis current $I_H$, the conditions for switching arise only when the rectified voltage $V_X$ drops below a lower hysteresis threshold $V_{HL}$ (FIG. 4, instant $t_2$), which in the embodiment illustrated is $$V_{HL} = \frac{R_1 + R_2}{R_2} V_0 - R_1 I_H$$

and is lower than the upper hysteresis threshold $V_{HH}$ (the quantity $R_1 I_H$ is positive).

In this case, the enable voltage $V_{EN}$ switches once again to the second value $V_{EN2}$ (falling edge), thus deactivating the current generator 33 (the input voltage $V_Y$ is thus decremented by the amount $\Delta V$ in a transient of duration $t_D$). In addition, the timer 41 supplies a new timing pulse $S_T$ in response to switching of the enable voltage $V_{EN}$. The first two-way selector 42 and the second two-way selector 43 thus connect the first hysteresis voltage source 39 to the second input 27b of the comparator circuit 27, which receives the first hysteresis reference voltage $V_1$.

For the duration T of the timing pulse $S_T$ (up to the instant $t_2+T$, FIG. 4), the comparator circuit 27 switches once again only if the input voltage $V_Y$ (from which the amount $\Delta V$ has been subtracted) rises above the first hysteresis reference voltage $V_1$ (which is higher than the standard reference voltage $V_0$).

Once the timing pulse $S_T$ terminates, the initial condition of the comparator with hysteresis 25 is restored.

The comparator with hysteresis 25 exploits current and voltage hysteresis together in order to mask effectively any possible rebounds of the rectified voltage $V_X$ that may occur immediately after overstepping of the thresholds on account of disturbance and noise. Undesirable switchings are thus prevented.

Activation and deactivation of the current generator 33 following upon the switchings of the comparator circuit 27 enable modification of the value of the input voltage $V_Y$, alternatively by introducing or removing the amount $\Delta V$ so as to counter switchings due to transient variations and not to a trend of the rectified voltage $V_X$. In practice, the input voltage $V_Y$ is incremented as soon as the rectified voltage $V_X$ exceeds the upper hysteresis threshold $V_{HH}$ and is decremented as soon as the rectified voltage $V_X$ drops below the lower hysteresis threshold $V_{HL}$.

In addition, when the rectified voltage $V_X$ exceeds the upper hysteresis threshold $V_{HH}$ (and hence the enable voltage $V_{EN}$ switches on account of an increment in the input voltage $V_Y$, which exceeds the standard reference voltage $V_0$), the reference voltage on the second input 27b of the comparator circuit 27 is decremented (passing from the value of the standard reference voltage $V_0$ to the value of the second hysteresis reference voltage $V_2$). When, instead, the rectified voltage $V_X$ drops below the lower hysteresis threshold $V_{HL}$ (and hence the enable voltage $V_{EN}$ switches on account of a decrement of the input voltage $V_Y$, which drops below the standard reference voltage $V_0$), the reference voltage on the second input 27b of the comparator circuit 27 is incremented (passing from the value of the standard reference voltage $V_0$ to the value of the first hysteresis reference voltage $V_1$).

Use of the timer 41 moreover makes it possible to limit the voltage hysteresis to a fixed duration after each switching of the comparator circuit 27. In this way, the input voltage $V_Y$ is normally compared with the same reference voltage (i.e., the standard reference voltage $V_0$) to determine the value of the enable voltage $V_{EN}$. Only after switchings of the comparator circuit 27 and limitedly for a time equal to the duration T of the timing pulses $S_T$, the input voltage $V_Y$ is compared with one between the first hysteresis reference voltage $V_1$ and the second hysteresis reference voltage $V_2$. In this way, it is possible to fix two independent thresholds for the rectified voltage $V_X$ (namely, the upper hysteresis threshold $V_{HH}$ and the lower hysteresis threshold $V_{HL}$), using simply a pair of resistors that define the divider 17.

In addition, the upper hysteresis threshold $V_{HH}$ and the lower hysteresis threshold $V_{HL}$ depend upon just a few parameters, i.e., only upon the resistances $R_1$, $R_2$ of the resistors 21, 22, the hysteresis current $I_H$, and the standard reference voltage $V_0$. The imprecisions due to the ineliminable process spread are thus limited.

Figure 5:
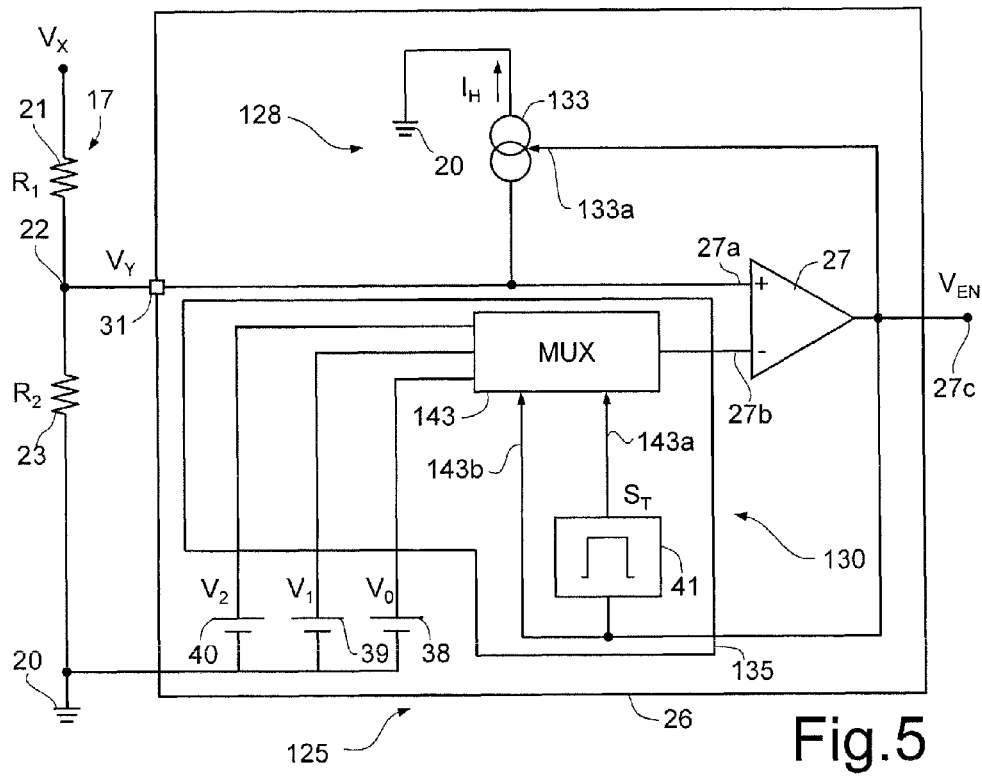
FIG. 5 is a circuit diagram of a threshold comparator with hysteresis, provided in accordance with a further embodiment of the present invention.

FIG. 5, where parts that are the same as to the ones already illustrated are designated by the same reference numbers, regards a different embodiment of the invention. In this case, the DC-DC converter 18 is provided with a comparator with hysteresis 125, which comprises the comparator circuit 27, a current hysteresis circuit 128, and a voltage hysteresis circuit 130.

The current hysteresis circuit 128 comprises a current generator 133, connected between the first input 27a of the comparator circuit 27 and the ground line 20, and controlled by the enable voltage $V_{EN}$. In particular, the current generator 133, which has a control input 133a connected to the output of the comparator circuit 27, detects a hysteresis current $I_H$ from the control node 22 when the enable voltage $V_{EN}$ has the second value $V_{EN2}$ (low), and is de-activated otherwise.

Figure 6:
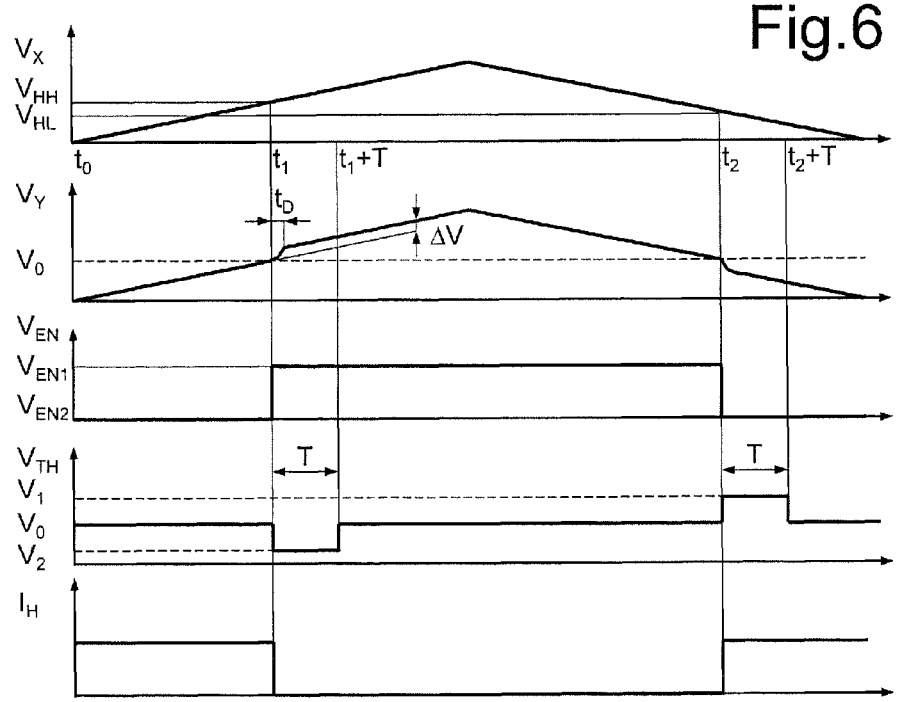
FIG. 6 shows graphs regarding the threshold comparator with hysteresis of FIG. 5.

The voltage hysteresis circuit 130 comprises a timed selector circuit 135 and, moreover, the standard voltage source 38 and the first and second hysteresis voltage sources 39, 40. The timed selector circuit 35 comprises the timer 41 and a multiplexer 143, which has connection inputs that are coupled to the standard voltage source 38, to the first hysteresis voltage source 39, and to the second hysteresis voltage source 40, and an output connected to the second input 27b of the comparator circuit 27. In addition, the multiplexer 143 has a first control input 143a and a second control input 143b, respectively connected to the output of the timer 41 and to the output 27c of the comparator circuit 27. As already described, the timer 41 generates timing pulses $S_T$ of duration T in response to switchings of the enable voltage $V_{EN}$. The multiplexer 143 is configured to respond to the timing pulses $S_T$ and to the values of the enable voltage $V_{EN}$ in the following way (see for reference also FIG. 6):

- in the absence of timing pulses $S_T$, the standard voltage source 38, which supplies the standard reference voltage $V_0$, is connected to the second input 27b of the comparator circuit 27;
- in the presence of a timing pulse $S_T$, the second hysteresis voltage source 40, which supplies the second hysteresis reference voltage $V_2$ (lower than the standard reference voltage $V_0$), is connected to the second input 27b of the comparator circuit 27 if the enable voltage $V_{EN}$ has the first value $V_{EN1}$; and
- in the presence of a timing pulse $S_T$, the first hysteresis voltage source 39, which supplies the first hysteresis reference voltage $V_1$ (higher than the standard reference voltage $V_0$), is connected to the second input 27b of the comparator circuit 27 if the enable voltage $V_{EN}$ has the second value $V_{EN2}$.

Finally, it is evident that modifications and variations may be made to the method and to the device described, without thereby departing from the scope of the present invention, as defined in the annexed claims.

In particular, it is understood that the invention is not limited only to the sector of the computers and power supplies, but can find advantageous application in all those cases in which it is necessary to make a comparison with hysteresis of a voltage with reference thresholds.

In addition, the hysteresis cycle may have any configuration. For example, the output voltage of the comparator circuit can switch so as to present falling edges for increasing values of the rectified input voltage and, vice versa, rising edges for decreasing values of the rectified input voltage.

The durations of the positive and negative portions of the voltage hysteresis may not be the same. In other words, the first hysteresis voltage source can remain connected to the second input 27b of the comparator circuit for a time different from the second hysteresis voltage source.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. Threshold comparator with hysteresis comprising:
   an input terminal;
   a comparator circuit, having a first input, coupled to the input terminal for receiving an input voltage, a second input and an output for providing an output voltage having a first value, when the first input is at a higher voltage than the second input, and a second value, when the first input is at a lower voltage than the second input;
   a current generator, coupled to the input terminal and controlled by the output voltage for supplying a hysteresis current to the input terminal in the presence of selectively one of the first value and the second value of the output voltage;
   at least a first reference voltage source and a second reference voltage source, for providing, respectively, a first reference voltage and a second reference voltage, lower than the first reference voltage;
   a selective coupling circuit, controlled by the output voltage of the comparator circuit and configured to couple the second input of the comparator circuit to the first reference voltage source, in response to first edges of the output voltage, and to the second reference voltage source, in response to second edges of the output voltage, opposite to the first edges; and
   a third reference voltage source, for providing a third reference voltage, intermediate between the first reference voltage and the second reference voltage, wherein the selective coupling circuit is configured to couple the second input of the comparator circuit to the third reference voltage source after a controlled duration since each first edge and since each second edge of the output voltage.

2. Comparator according to claim 1, wherein the selective coupling circuit comprises a selector device, having connection inputs respectively connected to the first reference voltage source, to the second reference voltage source and to the third reference voltage source, and a timer circuit coupled to the output of the comparator circuit for receiving the output voltage and configured to control the selector device so as to couple the second input of the comparator circuit to one of the first reference voltage source and the second reference voltage source for the duration in response to the first edges and to the second edges of the output voltage.

3. Comparator according to claim 2, wherein the selector device has a first control terminal connected to an output of the timer circuit and a second control terminal connected to the output of the comparator circuit for receiving the output voltage.

4. Comparator according to claim 2, wherein the selector device comprises a first two-way selector and a second two-way selector and wherein:
   the first two-way selector has inputs respectively connected to an output del second two-way selector and to the third reference voltage source, a control terminal defining the first control terminal and an output connected to the second input of the comparator circuit; and
   the second two-way selector has inputs respectively connected to the first reference voltage source and to the second reference voltage source and a control terminal defining the second control terminal.

5. Comparator according to claim 3, wherein the selector device comprises a multiplexer having connection inputs respectively connected to the first reference voltage source, to the second reference voltage source and to the third reference voltage source.

6. Comparator according to claim 2, wherein the timer circuit is configured to provide timing pulses having the duration, in response to each first edge and to each second edge of the output voltage.

7. Comparator according to claim 1, wherein the comparator circuit is configured so that the first edges are determined by decrements of the input voltage on first input of the comparator circuit and the second edges are determined by increments of the input voltage on the first input of the comparator circuit.

8. Comparator according to claim 1, wherein the current generator is controlled so as to cause a decrement of the input voltage, in response to the first edges of the output voltage, and an increment of the input voltage, in response to the second edges of the output voltage.

9. Comparator according to claim 1, comprising an input resistive divider having a first terminal and a second terminal, for receiving a voltage, and a control terminal, intermediate between the first terminal and the second terminal and connected to the input terminal.

10. Electronic apparatus comprising a threshold comparator with hysteresis according to claim 1.

11. Method for performing threshold comparison with hysteresis of a voltage comprising:
supplying an input voltage to a first input of a comparator circuit, having a second input and an output configured to provide an output voltage having a first value, when the first input is at a higher voltage than the second input, and a second value, when the first input is at a lower voltage than the second input;
supplying a hysteresis current to the first input in the presence of selectively one of the first value and the second value of the output voltage;
providing the second input of the comparator circuit with a first reference voltage, in response to first edges of the output voltage, and a second reference voltage, lower than the first reference voltage, in response to second edges of the output voltage, opposite to the first edges; and
providing the second input of the comparator circuit with a third reference voltage, intermediate between the first reference voltage and the second reference voltage, after a controlled duration since each first edge and since each second edge of the output voltage.

12. Method according to claim 11, wherein the comparator circuit is configured so that the first edges are caused by decrements of the input voltage on the first input of the comparator circuit and the second edges are caused by increments of the input voltage on the first input of the comparator circuit).

13. Method according to claim 11, wherein supplying the hysteresis current to the input terminal in the presence of selectively one of the first value and the second value of the output voltage comprises causing decrements of the input voltage, in response to the first edges of the output voltage, and increments of the input voltage, in response to the second edges of the output voltage.

14. A threshold comparator with hysteresis comprising:
a comparator circuit configured to provide an output voltage including a first output state when an input voltage on a first input is greater than a reference voltage on a second input and a second output state when the input voltage is less than the reference voltage;
a current source configured to supply a hysteresis current to the first input of the comparator circuit in response to only one of the output states of the comparator circuit to be inactive otherwise; and
a coupling circuit configured to couple a first reference voltage to the second input of the comparator circuit for a first predetermined time duration in response to a transition of the output voltage from the first output state to the second output state, and to couple a second reference voltage to the second input of the comparator circuit for a second predetermined time duration in response to a transition of the output voltage from the second output state to the first output state;
wherein the first predetermined time duration is equal to the second predetermined time duration; and
wherein the coupling circuit is further configured to couple a third reference voltage to the second input of the comparator circuit after the first predetermined time duration has expired.

15. A threshold comparator with hysteresis as defined in claim 14, wherein the coupling circuit includes a timing pulse generator configured to generate a timing pulse having the first predetermined time duration.

16. A threshold comparator with hysteresis as defined in claim 14, wherein the coupling circuit comprises:
a first selector circuit having an output coupled to the second input of the comparator circuit, a first input configured to receive the third reference voltage, a second input, and a control input;
a second selector circuit having an output coupled to the second input of the first selector, a first input configured to receive the first reference voltage, a second input configured to receive the second reference voltage, and a control input configured to receive the output voltage of the comparator circuit; and
a timing pulse generator having an output coupled to the control input of the first selector circuit and an input configured to receive the output voltage of the comparator circuit, wherein the first selector circuit couples the output of the second selector circuit to the second input of the comparator circuit in response to a timing pulse of the first predetermined time duration generated by the timing pulse generator.

17. A threshold comparator with hysteresis as defined in claim 14, wherein the coupling circuit comprises a multiplexer and a timing pulse generator, the multiplexer having an output coupled to the second input of the comparator circuit, a first input configured to receive the first reference voltage, a second input configured to receive the second reference voltage, a third input configured to receive the third reference voltage, and control inputs configured to receive the output voltage of the comparator circuit and a timing pulse of the first predetermined time duration generated by the timing pulse generator in response to a transition of the output state of the comparator circuit.

18. A method for performing threshold comparison with hysteresis, comprising:
providing, by a comparator circuit, an output voltage including a first output state when an input voltage on a first input is greater than a reference voltage on a second input and a second output state when the input voltage is less than the reference voltage;
supplying, by a current source, a hysteresis current to the first input of the comparator circuit in response to only one of the output states of the comparator circuit, the current source being inactive otherwise;
coupling, by a coupling circuit, a first reference voltage to the second input of the comparator circuit for a first predetermined time duration in response to a transition of the output voltage from the first output state to the second output state;
coupling, by the coupling circuit, a second reference voltage to the second input of the comparator circuit for a second predetermined time duration in response to a transition of the output voltage from the second output state to the first output state, wherein the first predetermined time duration is equal to the second predetermined time duration; and coupling a third reference voltage to the second input of the comparator circuit after the first predetermined time duration has expired.

19. A method for performing threshold comparison with hysteresis as defined in claim 18, wherein the coupling circuit includes a timing pulse generator that generates a timing pulse having the first predetermined time duration in response to a transition of the output state of the comparator circuit.

* * * * *